(12) United States Patent
Chen

(10) Patent No.: US 6,334,481 B1
(45) Date of Patent: Jan. 1, 2002

(54) RETAINER FOR A COOLING DEVICE

(75) Inventor: Jen-Hsiung Chen, Kaohsiung (TW)

(73) Assignee: Asia Vital Components Co., Ltd., Kaohsiung (TW)

( * ) Notice: Subject to any disclaimer, the term of this patent is extended or adjusted under 35 U.S.C. 154(b) by 0 days.

(21) Appl. No.: 09/848,355

(22) Filed: May 4, 2001

(51) Int. Cl.$^7$ .................................................. H05K 7/20
(52) U.S. Cl. ........................ 165/80.3; 165/121; 361/697
(58) Field of Search ............................... 165/80.3, 121, 165/185; 361/697, 704, 710

(56) References Cited

U.S. PATENT DOCUMENTS 5,486,980 A * 1/1996 Jordan et al. ............... 361/697
5,947,192 A * 9/1999 Kuo .......................... 165/80.3
6,071,185 A * 1/2000 Kuo .......................... 415/177
6,116,435 A * 9/2000 Young ....................... 211/84.01
6,118,657 A * 9/2000 Clemens ..................... 361/697

FOREIGN PATENT DOCUMENTS

JP        2000-31354 A   *   1/2000

* cited by examiner

Primary Examiner—Allen Flanigan
(74) Attorney, Agent, or Firm—Bacon & Thomas, PLLC

(57) ABSTRACT

A retainer for a cooling device according to the present invention comprises a locating frame for mounting a fan, a plurality of parallel fixing plates extending downward from the locating frame, and a cooling plate device with a plurality of cooling fins. The fixing plates are arranged in pairs and there is a gap provided between two neighboring fixing plates for accommodating two cooling fins. A locating through hole is provided in the locating frame corresponding to each fixing plate pair. As soon as the screws are turned to pass through each locating through hole respectively, the threads on each screw may force the two neighboring cooling fins to tightly engage with each pair of fixing plates.

3 Claims, 6 Drawing Sheets

RETAINER FOR A COOLING DEVICE

BACKGROUND OF THE INVENTION

1. Field of the Invention

The present invention relates to a retainer for a cooling device, and particularly to an improved retainer for a fan attached to cooling plates.

2. Description of Related Art

Presently, it is known that the computer is required equipment for an individual or a company and the running speed of computer is important to the user. However, the central processing unit (CPU), the printer, and chips for the computer having a high executing speed may overheat, resulting damage to the CPU, chips and etc. in the computer. In order to reduce the temperature of the CPU effectively, an extruded aluminum cooling plate device 2' is mounted on the CPU and a fan 1' is fixedly attached to the cooling plate device 2' by way of screws 3' being fastened between two neighboring cooling fins 21' on the cooling plate 2' as shown in FIG. 1 to perform the function of dissipating the generated heat. To permit greater executing speed of the CPU one may increase the rotation speed of fan or reduce the thickness cooling plate 2' as shown in FIG. 2. In order to improve heat transfer, the thickness of each cooling plate is reduced to 0.2~0.6 mm. But, reducing the thickness of the respective cooling plate so much leads to a reduced strength thereof, and it is difficult to attach the fan 1' to the cooling plates 2'. In order to attach the fan a plurality of hook locks 11' are arranged to extend downward from the fan 1' to engage with the bottom part of the cooling plates 22', as shown in FIG. 2. However, the hook locks 11' are extremely long and easily broken, resulting in a defect of fan 1' loosening and falling. Referring to FIG. 3, support frames 23' are provided around the cooling plates by way of welding and the fan 1' engages with the lower part 22' of the cooling plates instead of hook locks shown in FIG. 2. Although the fan 1' can be steadily supported by the support frames 23', it is a tedious job to weld the metal made support frame 23' to the cooling plates.

SUMMARY OF THE INVENTION

A retainer for a cooling device according to the present invention comprises a locating frame for fixing a fan, a plurality of parallel fixing plates extending downward from the locating frame, and a cooling plate device with a plurality of cooling fins which can engage the fixing plates. The fixing plates are arranged in pairs, and there is a gap provided between these two neighboring fixing plates for accommodating two cooling fins. A locating through hole is provided in the locating frame corresponding to each fixing plate pair. As soon as the screws are turned to pass through each locating through hole respectively, the threads on each screw may force the two neighboring cooling fins to tightly engage with each pair of fixing plates.

An object of the present invention is to provide a retainer for a cooling device, in which a locating frame can be arranged to support a fan steadily.

Another object of the present invention is to provide a retainer for a cooling device, in which a plurality of fixing plates extend downward in pairs, with a gap in between just for fitting two cooling fins only.

A further object of the present invention is to provide a retainer for a cooling device, in which a plurality of locating through holes are arranged in the locating frame to correspond to the fixing plate pairs.

A further object of the present invention is to provide a retainer for a cooling device, in which a plurality of screws pass through the locating holes with the threads thereon to press the two cooling fins fitting in each pair of fixing plates tightly against the corresponding fixing plate.

BRIEF DESCRIPTION OF THE DRAWINGS

The present invention can be more fully understood in the following description with reference to accompanying drawings, in which.

DETAILED DESCRIPTION OF THE PREFERRED EMBODIMENT

Figure 1:
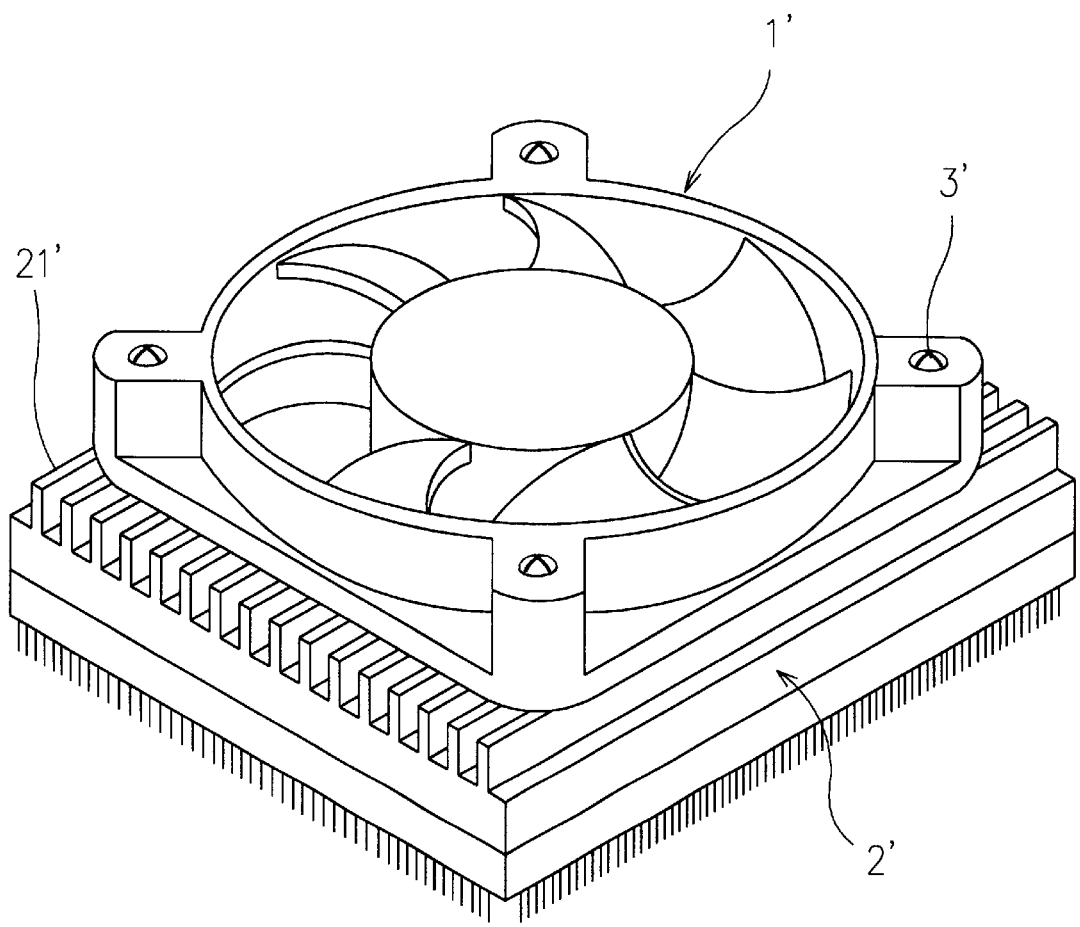
FIG. 1 is a perspective view of a conventional retainer for a cooling device.
Figure 2:
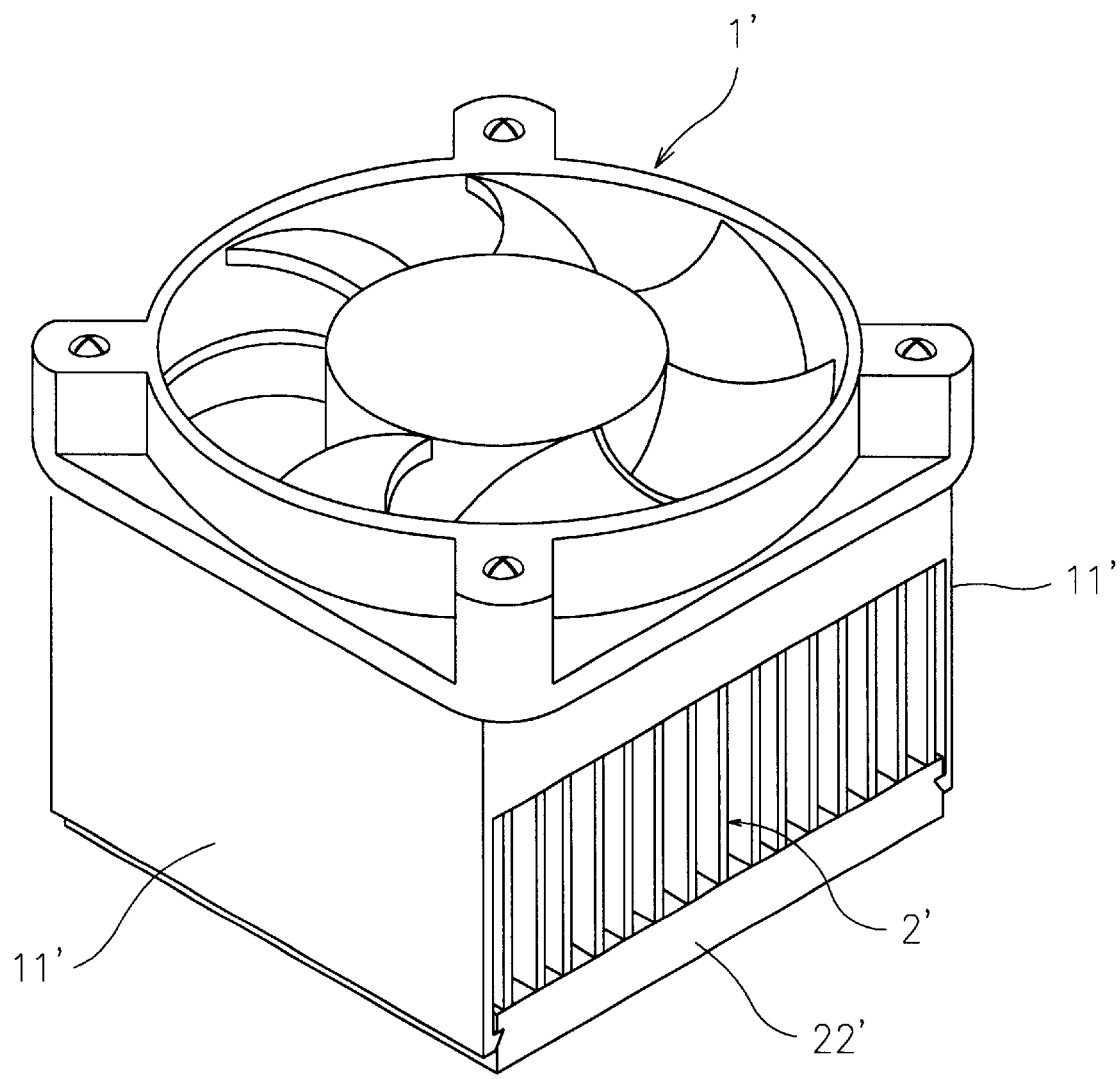
FIG. 2 is a perspective view of another conventional retainer for a cooling device.
Figure 3:
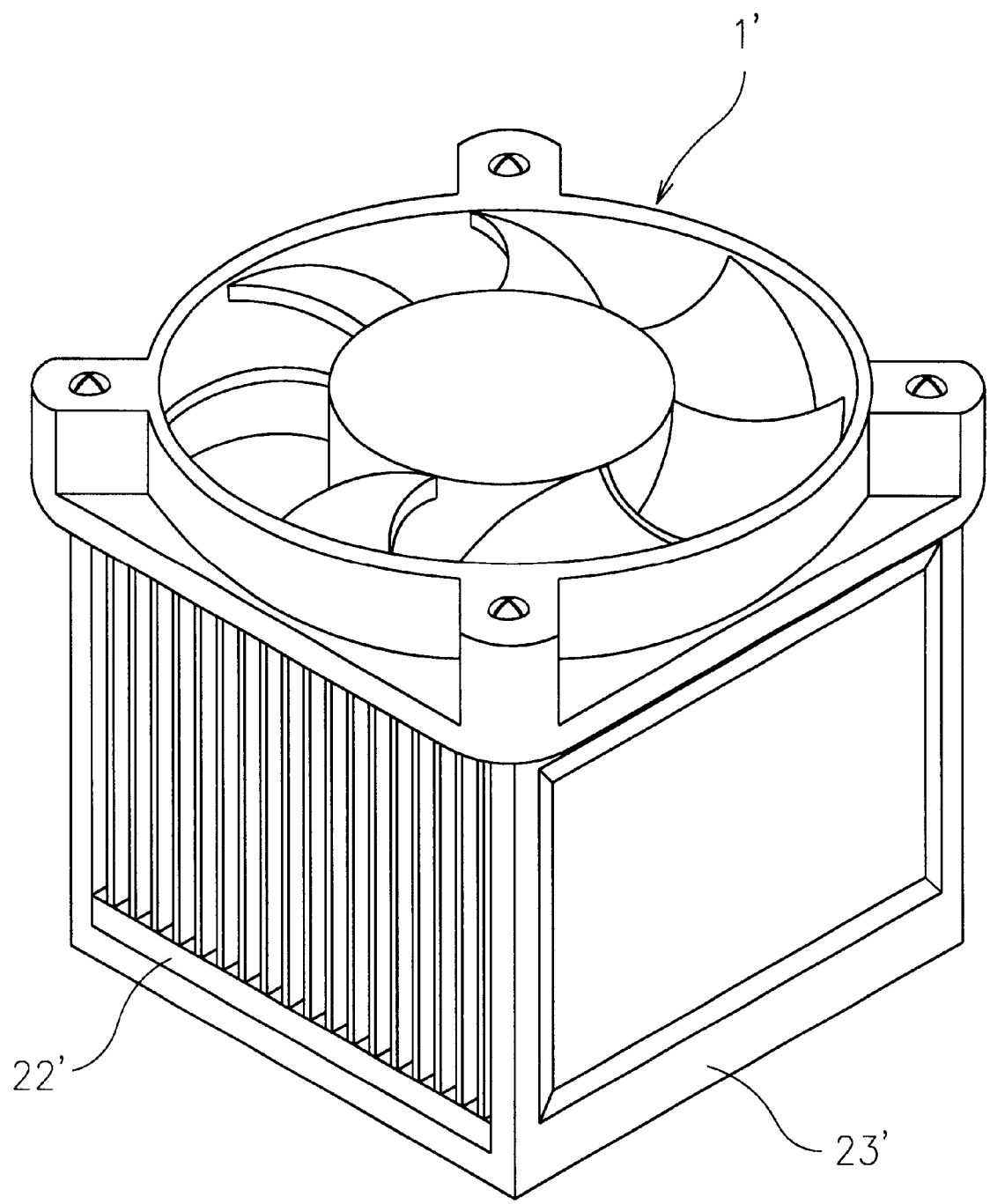
FIG. 3 is a perspective view of a further conventional retainer for a cooling device with thin cooling fins.
Figure 4:
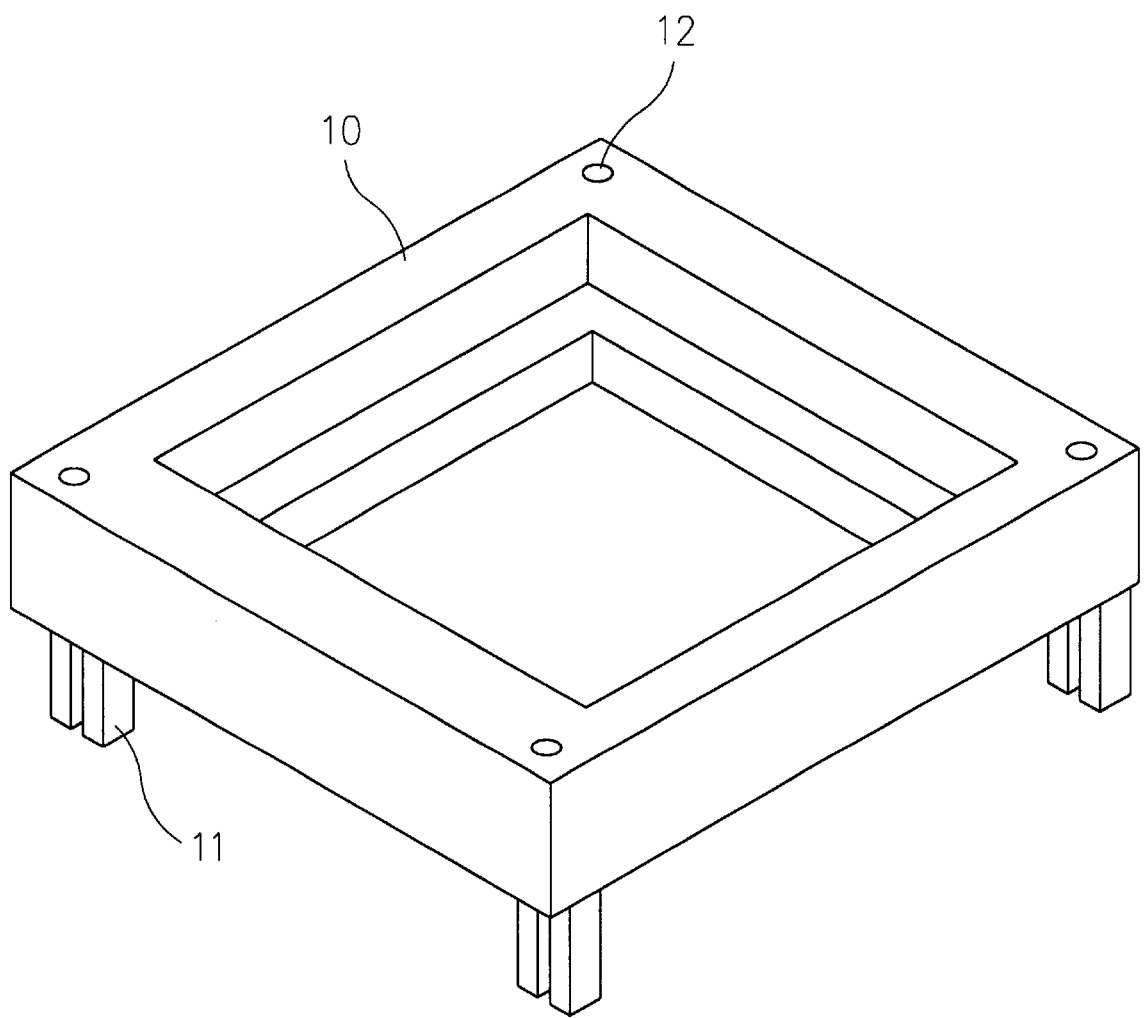
FIG. 4 is a perspective view of a cooling device according to the present invention.
Figure 5:
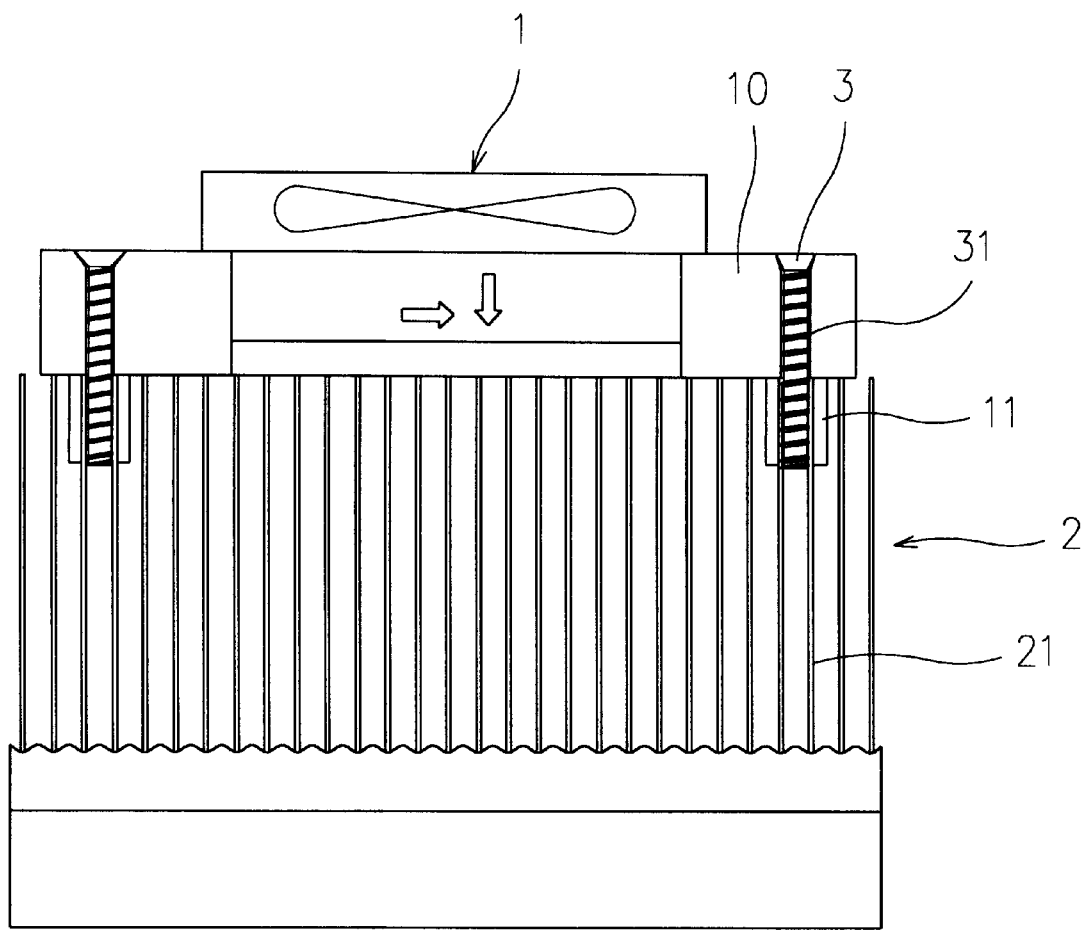
FIG. 5 is a plan view of the cooling device according to the present invention.
Figure 6:
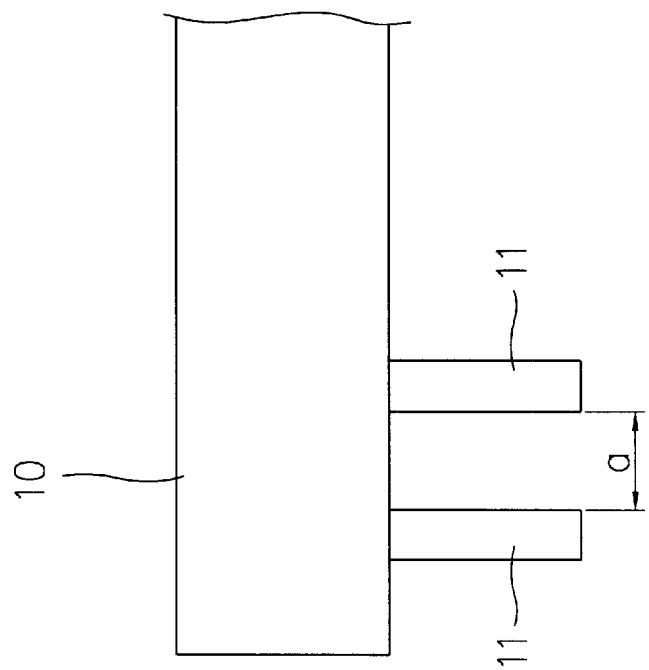
FIG. 6 is a fragmentary plan view of the cooling device according to the present invention.
Figure 7:
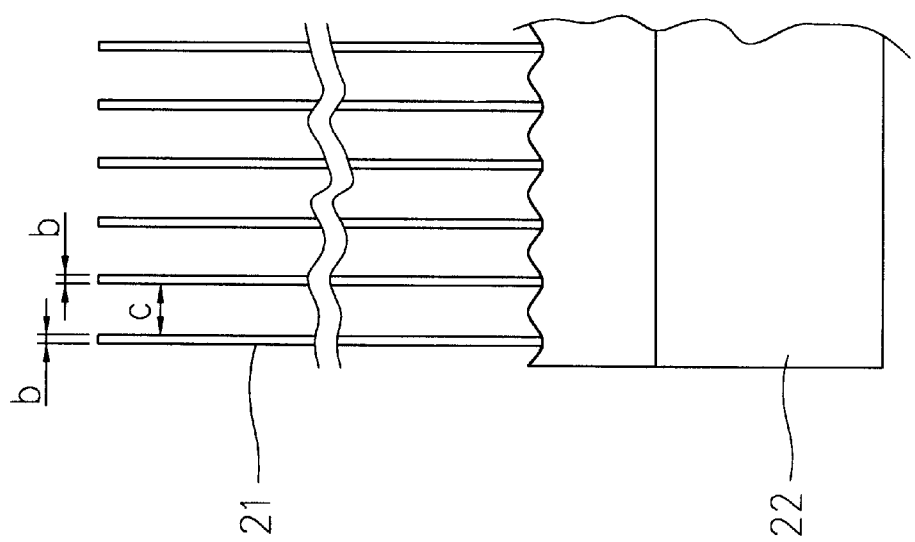
FIG. 7 is another fragmentary plan view of the cooling device according to the present invention.

First, referring to FIGS. 4 and 5, a retainer for a cooling device according to the present invention comprises a locating frame 10 for attaching a fan, a plurality of parallel fixing plates 11 extending downward from the locating frame 10, and a cooling plate device 2 with a plurality of cooling fins 21 which can engage surrounding the fixing plates 11. The fixing plates 11 are arranged in pairs, and there is a gap provided between these two neighboring fixing plates for accommodating two cooling fins 21. There are a plurality of locating through holes 12 provided in the locating frame 10 and each locating through hole 12 corresponds to each pair of fixing plates 11. As soon as the screws 3 are turned to pass through each locating through hole 12 respectively, the threads on each screw 12 may force the two neighboring cooling fins 21 to tightly engage with each pair of fixing plates 11, 11. Referring to FIGS. 6 and 7, the gap between two neighboring fixing plates 11 is designated as "a", the thickness of each cooling fin 21 is designated as "b", and the distance between two cooling fins 21 is designated as "c". Because "a" is equal to or slightly less than "b"+"c", the threads 31 on the respective screw 3 may force the two neighboring cooling fins 21 against the two neighboring fixing plates 11. Thus, the fan 1 can be fixedly attached to the cooling plate device 2 easily.

While the invention has been described with reference to a preferred embodiment, it is to be understood that modifications and variations may be easily made without departing from the spirit of this invention defined by the appended claim.

What is claimed is:

1. A retainer for a cooling device, comprises
   a locating frame, providing a space for receiving a fan, having a plurality of locating through holes;
   a plurality of fixing plates, extending downward from the locating frame, every two of said fixing plates being arranged in a pair respectively with a gap between said two fixing plates, and each of said fixing plate pairs corresponding to each of said locating holes respectively; and a plurality of cooling fins in said cooling device, every two of said cooling fins being received in the gap in each of said fixing plate pairs and pressed by threads on a respective screw passing through the locating through holes respectively against the fixing plates besides the said two cooling fins respectively.

2. The retainer for a cooling device as defined in claim 1, wherein the gap "a" between the two fixing plates in each of said fixing plate pairs is equal to a sum of two times of a thickness of one of said cooling fins "b" and a distance between two of said cooling fins "c".

3. The retainer for a cooling device as defined in claim 1, wherein the gap "a" between the two fixing plates in each of said fixing plate pairs is slightly less than a sum of two times of a thickness of one of said cooling fins "b" and a distance between two of said cooling fins "c".

* * * * *